US012777597B2

(12) United States Patent
Hwang et al.

(10) Patent No.: US 12,777,597 B2
(45) Date of Patent: Oct. 27, 2026

(54) DISPLAY DEVICE

(71) Applicant: SAMSUNG ELECTRONICS CO., LTD., Suwon-si (KR)

(72) Inventors: Yongyeon Hwang, Suwon-si (KR); Kyungmin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

(21) Appl. No.: 18/921,965

(22) Filed: Oct. 21, 2024

(65) Prior Publication Data

US 2025/0048570 A1 Feb. 6, 2025

Related U.S. Application Data

(63) Continuation of application No. PCT/KR2023/006273, filed on May 9, 2023.

(30) Foreign Application Priority Data

Jun. 28, 2022 (KR) ........................ 10-2022-0079301

(51) Int. Cl.
*H05K 5/02* (2006.01)

(52) U.S. Cl.
CPC .................................. *H05K 5/0217* (2013.01)

(58) Field of Classification Search
CPC ............ H05K 5/0217; G02F 1/133317; G02F 1/133328; G02F 1/133305; G02F 1/13452;

(Continued)

(56) References Cited

U.S. PATENT DOCUMENTS 7,724,317 B2 5/2010 Kim et al.
7,826,206 B2 11/2010 Woo (Continued)

FOREIGN PATENT DOCUMENTS

CN 113808494 A 12/2021
JP 10-222088 A 8/1998

(Continued)

OTHER PUBLICATIONS

Communication dated Jun. 3, 2025, issued by European Patent Office in European Patent Application No. 23831716.8.

(Continued)

*Primary Examiner* — Anne M Hines
*Assistant Examiner* — Jose M Diaz
(74) *Attorney, Agent, or Firm* — Sughrue Mion, PLLC

(57) ABSTRACT

A display device includes: a display panel; a rear chassis provided on a rear side of the display panel; a first frame in which the display panel is provided, and covering an upper border, a left border, and a right border of the display panel; a middle frame provided on a lower end of the display panel to be exposed to an outside, and comprising a plurality of hooks; and a second frame comprising an assembly groove assembled to the plurality of hooks, and provided in a bar shape to cover a lower border of the display panel by being assembled to the middle frame, where the plurality of hooks includes: a plurality of first hooks assembled to the assembly groove of the second frame, and a pair of second hooks provided at opposite ends of the middle frame and assembled to opposite ends of the first frame.

15 Claims, 24 Drawing Sheets

(58) Field of Classification Search
CPC .......... G02F 1/133308; G02F 2201/46; H10K 59/87; H10K 77/111
See application file for complete search history.

(56) References Cited

U.S. PATENT DOCUMENTS

| | | | |
|---|---|---|---|
| 7,864,260 B2 | 1/2011 | Lee et al. | |
| 8,908,119 B2 | 12/2014 | Han et al. | |
| 9,459,477 B2 | 10/2016 | Lee et al. | |
| 9,766,488 B2 | 9/2017 | Nishi et al. | |
| 10,101,958 B2 | 10/2018 | Kim et al. | |
| 10,126,591 B2 | 11/2018 | Yoo et al. | |
| 11,422,396 B2 | 8/2022 | Baek et al. | |
| 2008/0150851 A1 | 6/2008 | Takaira et al. | |
| 2008/0297681 A1 | 12/2008 | Yang et al. | |
| 2014/0362325 A1* | 12/2014 | Lee | G02F 1/133308 445/24 |
| 2016/0286670 A1 | 9/2016 | Wang et al. | |

FOREIGN PATENT DOCUMENTS

| | | |
|---|---|---|
| JP | 2011-203706 A | 10/2011 |
| JP | 5554870 B1 | 7/2014 |
| JP | 2018-169475 A | 11/2018 |
| KR | 10-0803146 B1 | 2/2008 |
| KR | 10-2008-0056867 A | 6/2008 |
| KR | 10-2008-0059515 A | 6/2008 |
| KR | 10-2008-0107630 A | 12/2008 |
| KR | 10-2012-0013664 A | 2/2012 |
| KR | 10-1377005 B1 | 3/2014 |
| KR | 10-1451737 B1 | 10/2014 |
| KR | 10-2018-0054254 A | 5/2018 |
| KR | 10-1950841 B1 | 2/2019 |
| KR | 10-2175948 B1 | 11/2020 |
| KR | 10-2022-0026227 A | 3/2022 |
| KR | 10-2374544 B1 | 3/2022 |

OTHER PUBLICATIONS

International Search Report (PCT/ISA/210) issued by the International Searching Authority on Aug. 23, 2023 in corresponding International Application No. PCT/KR2023/006273.
Written Opinion (PCT/ISA/237) issued by the International Searching Authority on Aug. 23, 2023 in corresponding International Application No. PCT/KR2023/006273.
Office Action issued Apr. 1, 2026 by the Korean Ministry of Intellectual Property for KR Patent Application No. 10-2022-0079301.
Communication issued Feb. 25, 2026 by the European Patent Office for EP Patent Application No. 23 831 716.8.

* cited by examiner

DISPLAY DEVICE

CROSS-REFERENCE TO RELATED APPLICATION(S)

This application is a continuation of International Application No. PCT/KR2023/006273, filed on May 9, 2023, in the Korean Intellectual Property Receiving Office, which is based on and claims priority to Korean Patent Application No. 10-2022-0079301, filed on Jun. 28, 2022, in the Korean Intellectual Property Office, the disclosures of which are incorporated by reference herein in their entireties.

BACKGROUND

1. Field

The disclosure relates to a display device having an improved structure of a frame on which a display panel is mounted in a bezel-less display device.

2. Description of Related Art

In general, a display device is a device that displays a screen, such as a monitor, a television (TV), or the like. Display devices use self-emissive display panels, such as organic light-emitting diodes (OLEDs), and non-emissive display panels, such as liquid crystal display (LCD) panels.

Recently, bezel-less display devices have become more popular due to their fuller screen and simpler design. A bezel-less display device may include a display panel that displays an image and a frame on which the display panel is mounted. When the display panel is seated on the frame, the frame may form the appearance of a four-sided border of the bezel-less display device.

The bottom of the display panel is connected to a chip-on-film (COF) that transmits a drive signal from a drive printed circuit board (PCB) to the display panel. The COF is required to be folded and organized on the back of the display panel so that it is not visible from the exterior of the product. To fold and organize the COF to the back of the display panel, first the frame at the bottom of the display panel needs to be separated from the display panel and spread away, then the COF needs to be inserted into a space between the display panel and the frame, and finally the COF needs to be folded to the back of the display panel, resulting in inconvenience. In addition, the COF may be damaged in the process of organizing the COF.

To organize the COF as described above, the frame assembled on the bottom of the display panel is assembled with a screw, so that after the COF is organized, the frame is assembled on the bottom of the display panel. However, since the frame is assembled on the bottom of the display panel by screws, a separate bracket for assembling the screws is required to be pre-assembled to the frame assembled on the bottom of the display panel. In addition, since the frame is assembled with screws to the bottom of the display panel, the screws may be exposed to the outside.

SUMMARY

Provided is a display device including a frame on which a display panel is seated in a bezel-less display device is divided into a first frame forming an upper, left, and right border appearance of the display panel, and a second frame forming a lower border appearance of the display panel.

Further, provided is a display device in which a second frame forming a lower border appearance of a display panel is hooked to a lower portion of the display panel.

Additional aspects will be set forth in part in the description which follows and, in part, will be apparent from the description, or may be learned by practice of the presented embodiments.

According to an aspect of the disclosure, a display device may include: a display panel; a rear chassis provided on a rear side of the display panel; a middle frame provided on a lower end of the display panel, and comprising a plurality of hooks; a first frame in which the display panel is provided, and covering an upper border, a left border, and a right border of the display panel to cause the middle frame at the lower end of the display panel to be exposed; and a second frame comprising an assembly groove assembled to the plurality of hooks, and provided in a bar shape to cover a lower border of the display panel by being assembled to the middle frame, where the plurality of hooks includes: a plurality of first hooks assembled to the assembly groove of the second frame, and a pair of second hooks provided at opposite ends of the middle frame and assembled to opposite ends of the first frame and opposite ends of the second frame, and where the opposite ends of the first frame are in contact with opposite ends of the second frame.

A chip-on film (COF) may be connected to the lower end of the display panel and configured to transmit a drive signal from a drive printed circuit board to the display panel.

The COF may be guided by the middle frame to bend toward the rear side of the display panel such that the COF is not exposed to the outside, and where the second frame is assembled to the middle frame in a state in which the COF is bent.

The first frame may include a hook groove provided at the opposite ends of the first frame and to which the pair of second hooks are assembled.

A portion of the pair of second hooks may be assembled to the assembly groove at the opposite ends of the second frame, and a remaining portion is assembled to the hook groove of the first frame, where, in a state in which the second frame is assembled to the middle frame, an end of the first frame is aligned with an end of the second frame.

The middle frame may have a length corresponding to the lower end of the display panel.

The first frame may include an extension extending horizontally from left and right ends of the first frame corresponding to left and right ends of the display panel so as to be assembled to the middle frame.

The extension may be extended so that corners of the display panel have a round shape.

Each second hook among the pair of second hooks may be integrally formed, a portion of which is assembled to the second frame, and a remaining portion of which is assembled to the extension of the first frame.

The middle frame may include an extension extending vertically from left and right ends of the middle frame corresponding to opposite ends of the lower end of the display panel.

Left and right ends of the first frame may have a length corresponding to left and right ends of the display panel which are assembled to the extension of the first frame.

Each second hook among the pair of second hooks may be integrally formed, a portion of which is formed on the extension and assembled to the first frame, and a remaining portion of which is assembled to the second frame.

The assembly groove may include a first assembly groove to which the plurality of first hooks is assembled, and a second assembly groove to which the pair of second hooks is assembled.

The first assembly groove and the second assembly groove may be connected to a single groove.

The first assembly groove may be provided at a plurality at positions corresponding to the plurality of first hooks, and the second assembly groove may be provided at the opposite ends of the second frame corresponding to the pair of second hooks.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
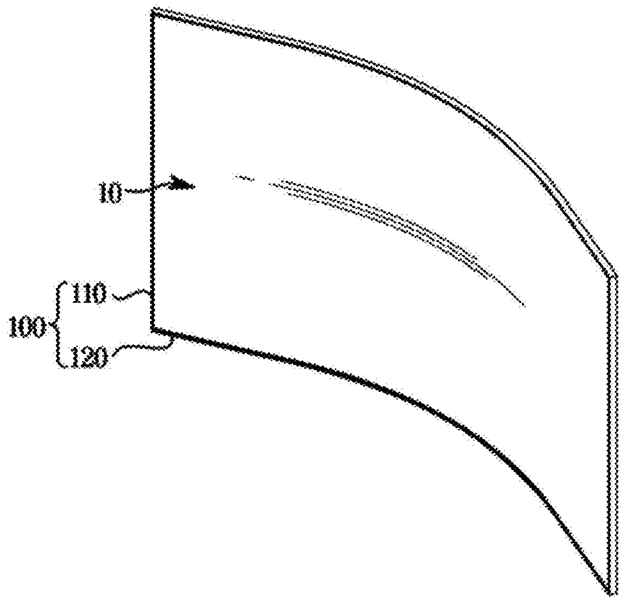
FIG. 1 is a view illustrating a display device according to an embodiment.

Embodiments described in the disclosure and configurations shown in the drawings are merely examples of the embodiments of the disclosure and may be modified in various different ways at the time of filing of the present application to replace the embodiments and drawings of the disclosure.

In connection with the description of the drawings, similar reference numerals may be used for similar or related components and redundant descriptions thereof will be omitted.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", "comprising", and the like are used to specify features, figures, steps, operations, elements, components, or combinations thereof, but do not preclude the presence or addition of one or more of the features, figures, steps, operations, elements, components, or combinations thereof.

It will be understood that, although the terms "first", "second", "primary", "secondary", etc., may be used herein to describe various elements, but the elements are not limited by these terms. These terms are only used to distinguish one element from another element. For example, without departing from the scope of the disclosure, a first element may be termed as a second element, and a second element may be termed as a first element. The term of "and/or" includes a plurality of combinations of any number of listed items or any one item among a plurality of listed items.

As used herein, the terms "front", "rear", "upper", "lower", "left", "right", and the like are defined with reference to the drawings and are not intended to limit the shape and location of each component.

Hereinafter, various embodiments of the disclosure will be described in detail with reference to the accompanying drawings.

Figure 2:
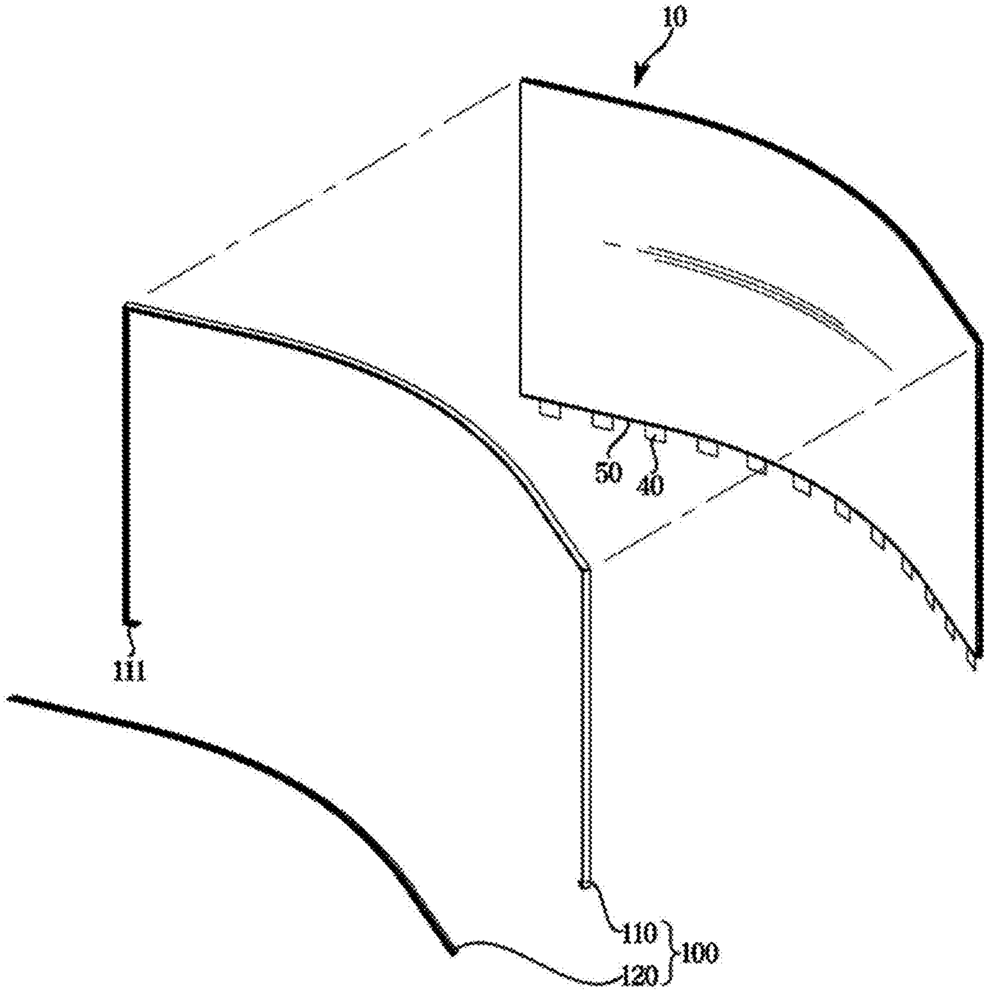
FIG. 2 is a view illustrating a frame separated from a display panel, according to an embodiment.
Figure 3:
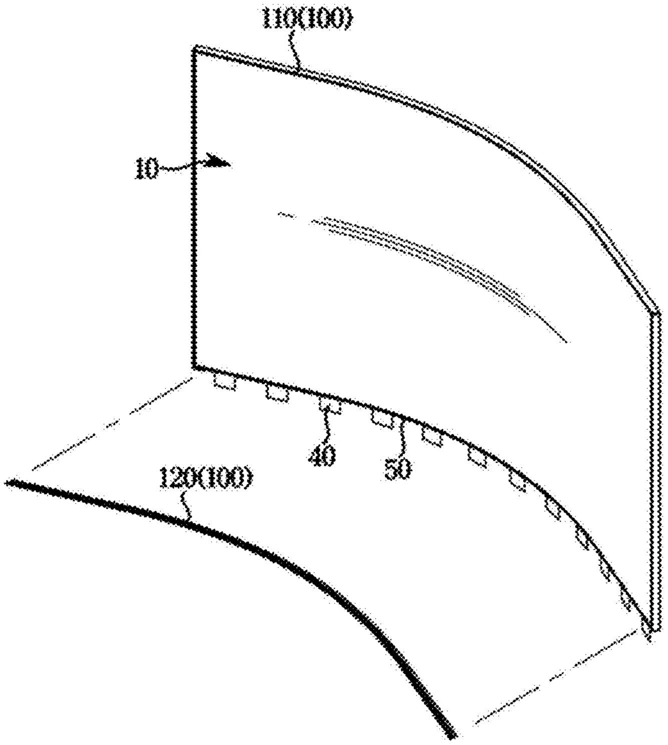
FIG. 3 is a view illustrating a first frame assembled and a second frame disconnected, according to an embodiment.
Figure 4:
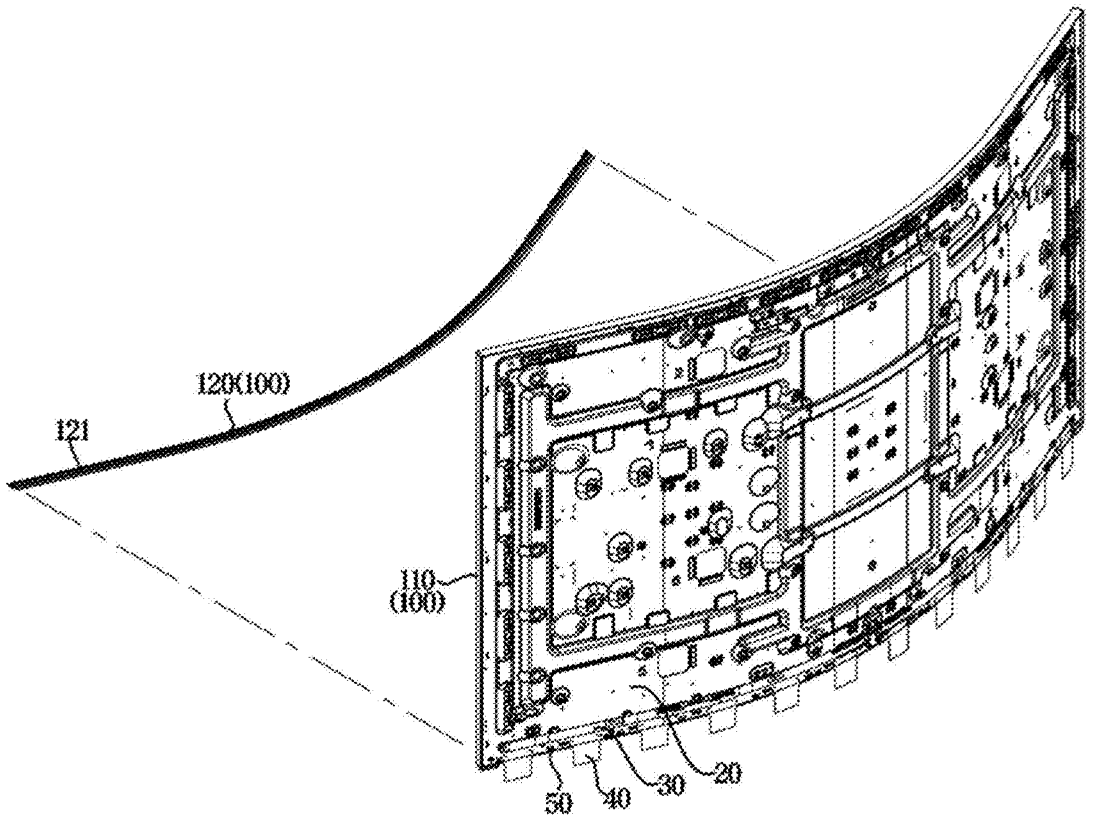
FIG. 4 is a rear view of the display device shown in FIG. 3 according to an embodiment.

FIG. 1 is a view illustrating a display device according to an embodiment. FIG. 2 is a view illustrating a frame separated from a display panel, according to an embodiment. FIG. 3 is a view illustrating a first frame assembled and a second frame disconnected, according to an embodiment. FIG. 4 is a rear view of the display device shown in FIG. 3.

As shown in FIGS. 1 to 4, the display device may be a curved display device. The display device may be a bezel-less display device. The display device may include an analog television (TV), a digital TV, a three-dimensional (3D) TV, a smart TV, a light emitting diode (LED) TV, an organic light emitting diode (OLED) TV, a plasma TV, a quantum dot TV, and/or a monitor. However, the display device is not limited to a curved display device. In other words, the display device may be a flat panel display device.

The display device may include a display module that displays image information and a stand that rotatably supports the display module.

The display module may include a display panel 10 that displays an image, a backlight unit disposed on a rear side of the display panel 10 to emit light to the display panel 10, a rear chassis 20 disposed on a rear side of the backlight unit, which is the rear side of the display panel 10, and a frame 100 on which the display panel 10 is seated. Since the display device is a bezel-less display device, i.e., without a bezel, the frame 100 on which the display panel 10 is seated may cover four side borders of the display panel 10. A rear cover may be assembled on a rear side of the rear chassis 20. The rear cover may form a rear exterior of the display device.

A drive printed circuit board (PCB) 30 may be mounted on the rear side of the rear chassis 20. The drive PCB 30 may transmit a drive signal to the display panel 10. The drive PCB 30 may convert an electrical signal provided from the outside into an image and sound and transmit the converted signal to the display panel 10. Although the drive PCB 30 is shown as being mounted on the rear side of the rear chassis 20 in the drawings, it is not limited thereto. In other words, the drive PCB 30 may be mounted on a front side of the rear cover. In addition, the drive PCB 30 may be mounted on the rear side of the display panel 10.

The drive PCB 30 may be connected to the display panel 10 by a chip-on-film (COF) 40. The COF 40 may be integrally formed of a bendable film cable made of a flexible material and a driver integrated circuit (IC). The driver IC may receive a drive signal and image and audio data through the film cable, and may transmit the drive signal and image and audio data to the display panel 10 through the film cable. The COF 40 may be connected to a lower end of the display panel 10 on one side and to the drive PCB 30 on the other side (see FIG. 7).

A middle frame 50 may be provided at the lower end of the display panel 10. The middle frame 50 may be injection molded. The middle frame 50 may be provided at the lower end of the display panel 10 and may be exposed to the outside. The middle frame 50 may be formed to have a length corresponding to the lower end of the display panel 10. The middle frame 50 may guide the COF 40 connected to the lower end of the display panel 10 to bend toward the rear side of the display panel 10. A detailed description of the middle frame 50 will be described below.

The display panel 10 may be seated on the frame 100. The frame 100 may be extrusion molded. The frame 100 may cover the four side borders of the display panel 10 without a bezel. In other words, the frame 100 may cover an upper, lower, left, and right borders of the display panel 10. The frame 100 may form an appearance of the four side borders of the display panel 10.

The frame 100 may include a first frame 110 formed in a C-shape to cover the upper, left, and right borders of the display panel 10. The display panel 10 may be seated on the first frame 110. Based on the display panel 10 being seated on the first frame 110, the lower end of the display panel 10 may be exposed to the outside because the first frame 110 is formed in the C-shape to cover the upper, left, and right borders of the display panel 10. In other words, based on the display panel 10 being seated on the first frame 110, the middle frame 50 provided at the lower end of the display panel 10 may be exposed to the outside.

The frame 100 may include a second frame 120 formed in a bar shape to cover the lower border of the display panel 10. The second frame 120 may be assembled to the middle frame 50 at the lower end of display panel 10 exposed to the outside.

The first frame 110 and the second frame 120 may be provided separately to cover the four side borders of the display panel 10. In other words, after the display panel 10 is seated on the first frame 110, the second frame 120 covering the lower border of the display panel 10 may be hook-assembled to the middle frame 50 after the COF 40 connected to the lower end of the display panel 10 is bent toward the rear side of the display panel 10, which will be described in detail later.

Figure 5:
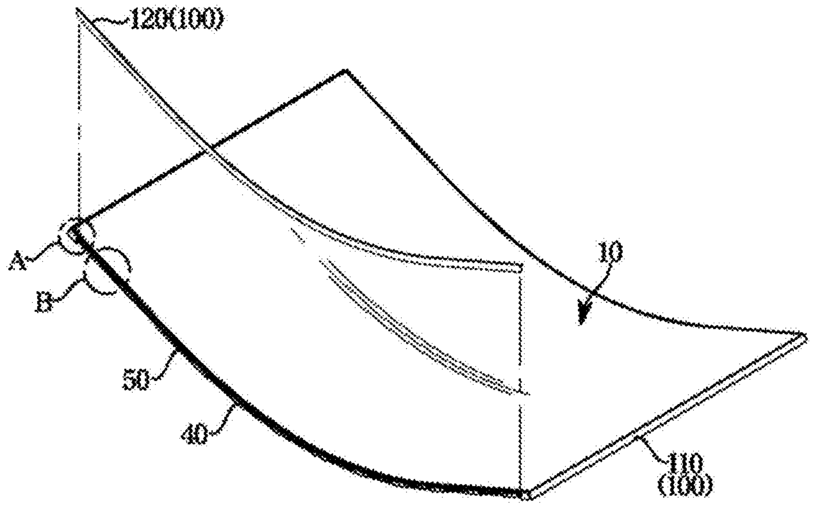
FIG. 5 is a view illustrating the second frame being assembled to a middle frame, according to an embodiment.
Figure 6:
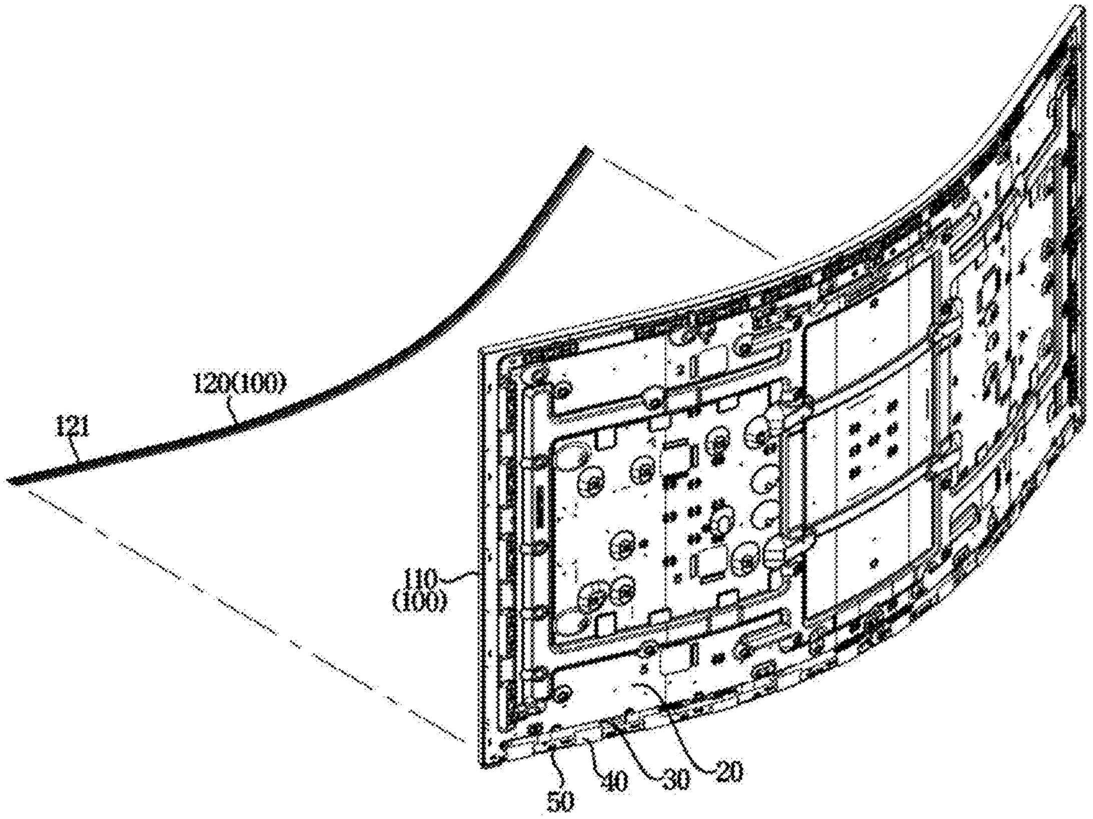
FIG. 6 is a rear view illustrating the second frame being assembled to the middle frame, according to an embodiment.
Figure 7:
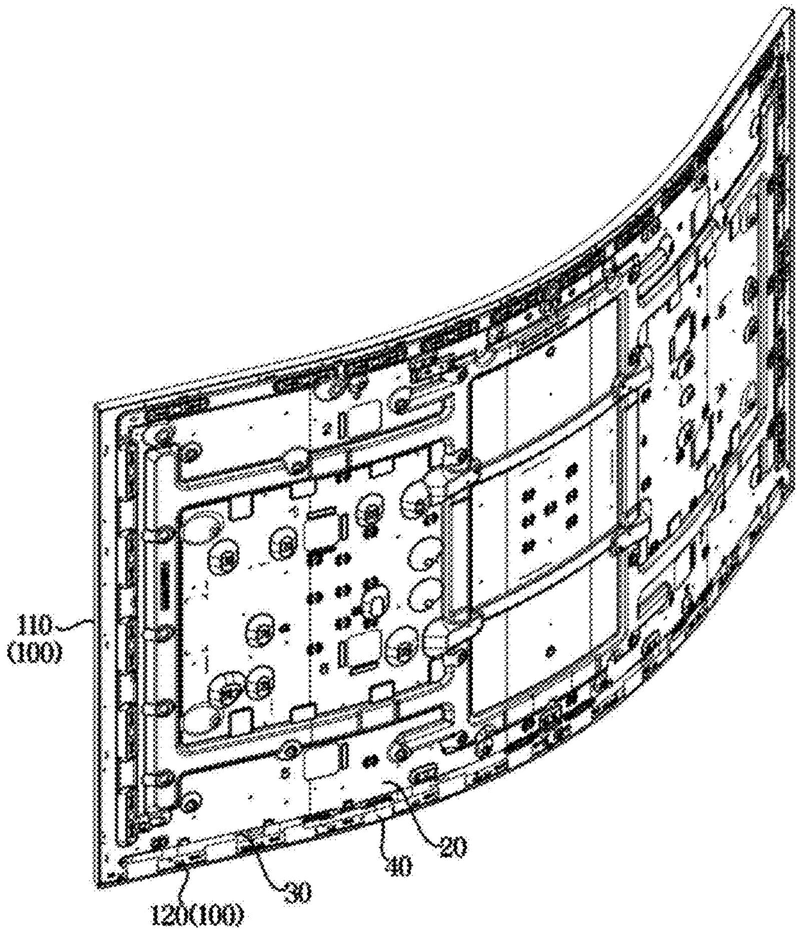
FIG. 7 is a rear view illustrating the second frame assembled to the middle frame, according to an embodiment.

FIG. 5 is a view illustrating the second frame being assembled to the middle frame, according to an embodiment. FIG. 6 is a rear view illustrating the second frame being assembled to the middle frame, according to an embodiment. FIG. 7 is a rear view illustrating the second frame assembled to the middle frame, according to an embodiment.

As shown in FIGS. 5 to 7, the COF 40 connected to the lower end of the display panel 10 may be guided by the middle frame 50 to bend toward the rear side of the display panel 10. In other words, the COF 40 may be organized by being bent toward the rear side of the display panel 10 so as to prevent the COF from being exposed to the outside.

The COF 40 bent toward the rear side of the display panel 10 may be connected to the drive PCB 30 mounted on the rear side of the rear chassis 20. In other words, the COF 40 may be connected at one end to the lower end of the display panel 10 and at the other end to the drive PCB 30 to transmit drive signals and image and audio data to the display panel 10.

Once the COF 40 is bent toward the rear side of the display panel 10 and connected to the drive PCB 30, the second frame 120 may be assembled to the middle frame 50. The second frame 120 may be hook-assembled to the middle frame 50 (see FIGS. 8 to 13).

Next, an end of the first frame and the second frame being hook-assembled to the middle frame will be described in detail with reference to FIGS. 8 to 14.

Figure 8:
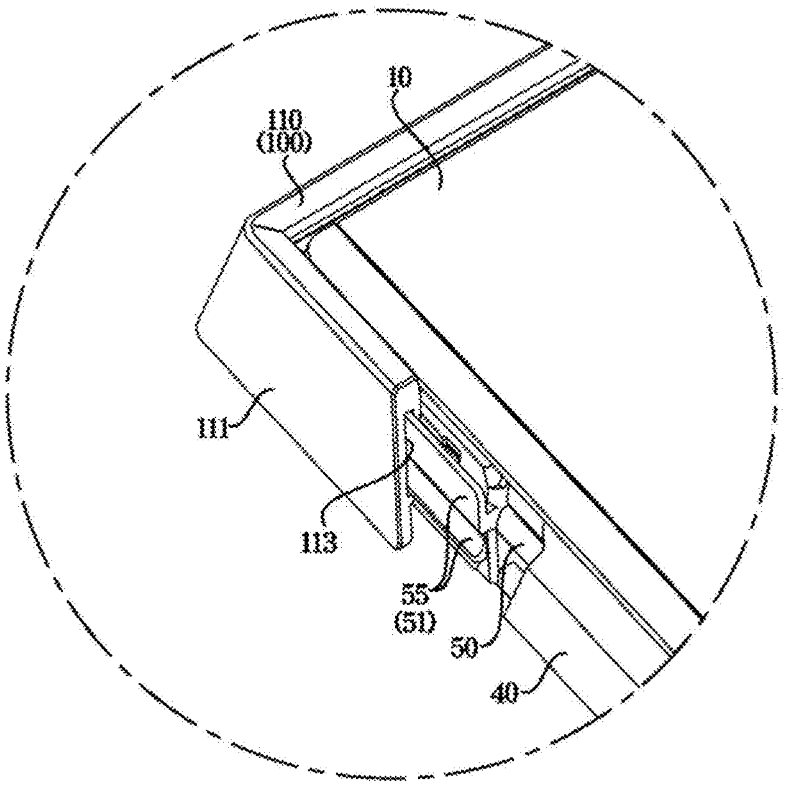
FIG. 8 is an enlarged view of portion A of FIG. 5 according to an embodiment.
Figure 9:
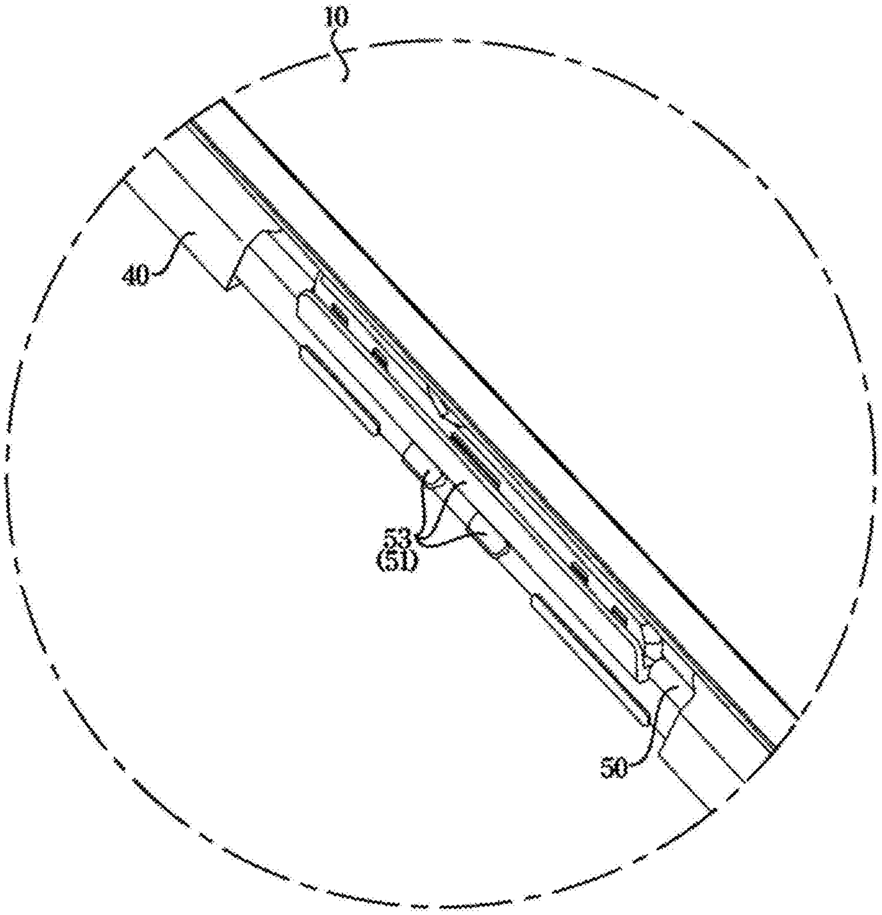
FIG. 9 is an enlarged view of portion B of FIG. 5 according to an embodiment.
Figure 10:
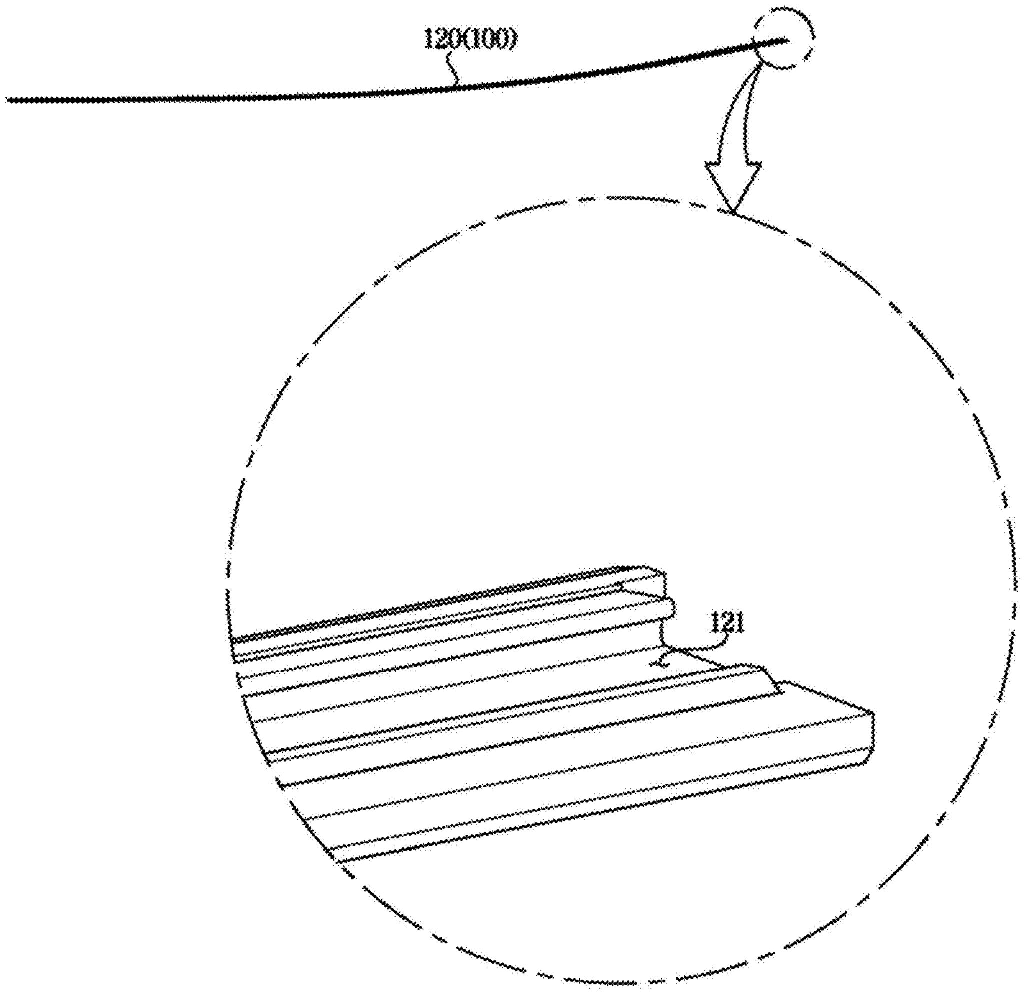
FIG. 10 is an enlarged view illustrating the second frame and a portion of the second frame, according to an embodiment.
Figure 11:
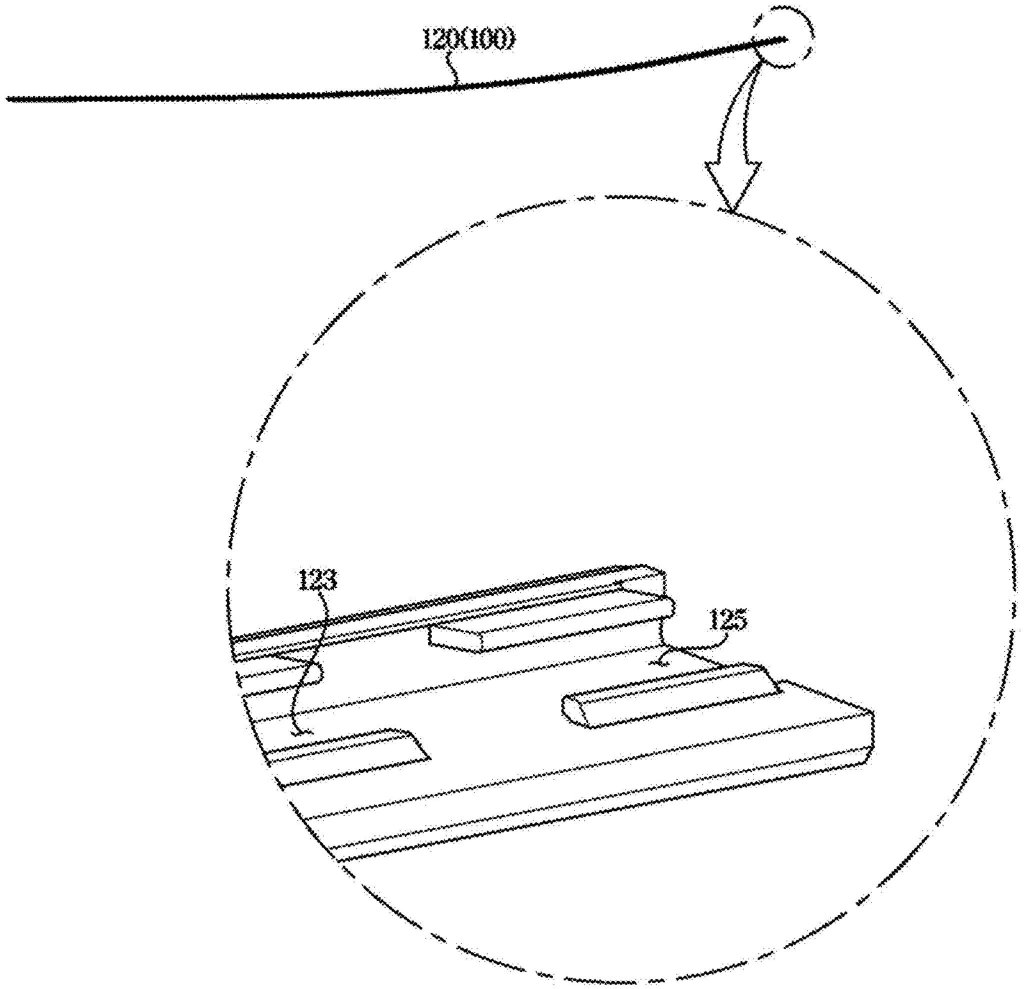
FIG. 11 is a view illustrating an assembly groove formed by dividing the assembly groove shown in FIG. 10 into a first assembly groove and a second assembly groove according to an embodiment.

FIG. 8 is an enlarged view of portion A of FIG. 5. FIG. 9 is an enlarged view of portion B of FIG. 5. FIG. 10 is an enlarged view illustrating the second frame and a portion of the second frame, according to an embodiment. FIG. 11 is a view illustrating an assembly groove formed by dividing the assembly groove shown in FIG. 10 into a first assembly groove and a second assembly groove.

As shown in FIGS. 8 to 10, the middle frame 50 may include a plurality of hooks 51. The plurality of hooks 51 may include a plurality of first hooks 53 to which the second frame 120 is assembled. The plurality of first hooks 53 may be formed on all but opposite ends of the middle frame 50. The second frame 120 may include an assembly groove 121 that is assembled to the plurality of first hooks 53. As described above, since the second frame 120 is assembled by the plurality of first hooks 53 formed on the middle frame 50, a separate bracket may not be required other than the middle frame 50. In other words, in the event that the second frame 120 assembled to the lower end of the display panel 10 is assembled to the middle frame 50 by a screw, a separate bracket for assembling the screw may be required to be assembled to the frame 100 in advance. However, since the second frame 120 is assembled by the plurality of first hooks 53 formed directly on the middle frame 50, a separate bracket for assembling the screw may not be required (see FIG. 5).

The plurality of hooks 51 may include a pair of second hooks 55 to which opposite ends of the first frame 110 and opposite ends of the second frame 120 are assembled. The pair of second hooks 55 may be formed at opposite ends of the middle frame 50. The first frame 110 may include the hook grooves 113 formed at opposite ends of the first frame 110 and assembled to the pair of second hooks 55. The second frame 120 may include the assembly grooves 121 formed at opposite ends of the second frame 120 that are assembled to the pair of second hooks 55. Accordingly, among the assembly grooves 121 formed in the second frame 120, the assembly grooves 121 formed at opposite ends of the second frame 120 may be assembled to the pair of second hooks 55. In addition, among the assembly grooves 121 formed in the second frame 120, the assembly grooves 121 formed between the opposite ends of the second frame 120 may be assembled to the plurality of first hooks 53. In other words, the assembly grooves 121 may be formed by being connected to a single groove.

As shown in FIG. 11, the assembly grooves 121 may include a first assembly groove 123 in which the plurality of first hooks 53 is assembled, and a second assembly groove 125 in which the pair of second hooks 55 are assembled. In other words, the assembly grooves 121 may include a plurality of first assembly grooves 123 formed between the opposite ends of the second frame 120 to correspond to the plurality of first hooks 53, and a pair of second assembly grooves 123 formed at each of the opposite ends of the second frame 120. The first assembly grooves 123 may each be formed at a position corresponding to the plurality of first hooks 53. However, the present disclosure is not limited thereto, and the first assembly grooves 123 may be formed by being connected to a single groove. In other words, the first assembly grooves 123 may be formed by being connected to a single groove so as to be separated from the pair of second assembly grooves 123.

Figure 12:
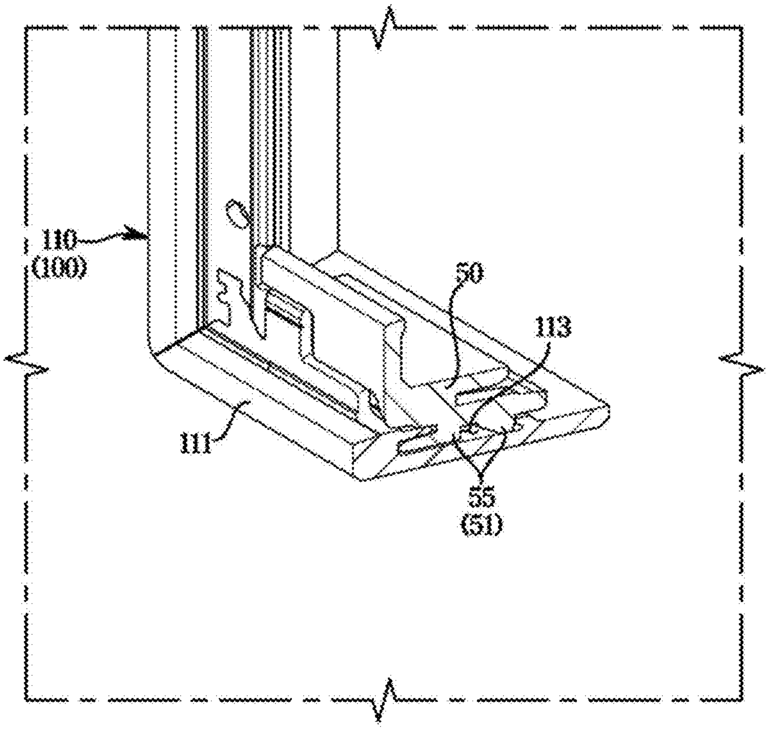
FIG. 12 is a cross-sectional view illustrating an end of the first frame assembled to a pair of second hooks of the middle frame, according to an embodiment.
Figure 13:
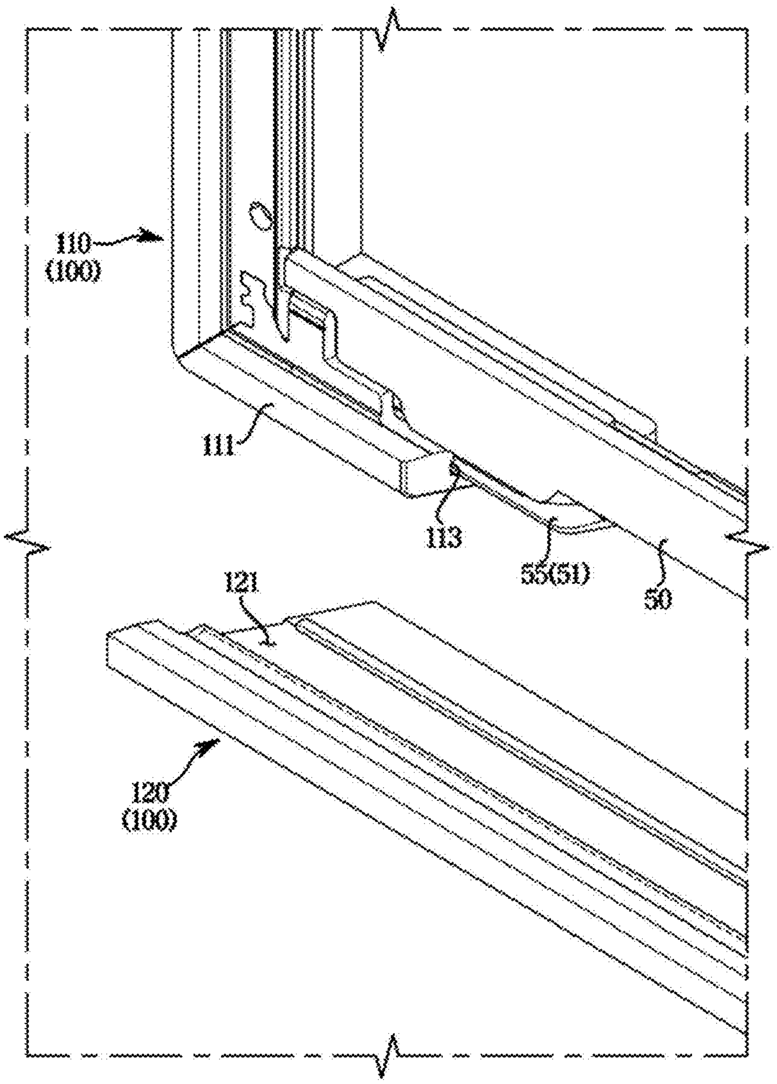
FIG. 13 is a view illustrating an end of the second frame assembled to the pair of second hooks of the middle frame to which the end of the first frame is assembled, according to an embodiment.
Figure 14:
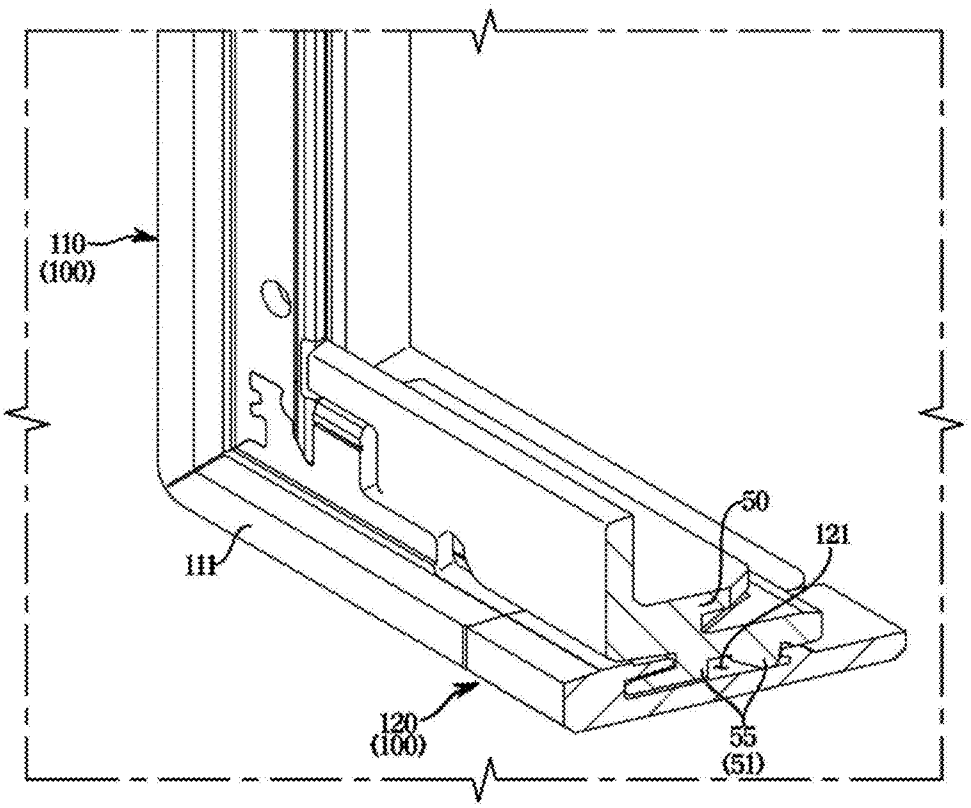
FIG. 14 is a cross-sectional view illustrating the ends of the first and second frames assembled on the pair of second hooks of the middle frame, according to an embodiment.

FIG. 12 is a cross-sectional view illustrating an end of the first frame assembled to the pair of second hooks of the middle frame, according to an embodiment. FIG. 13 is a view illustrating an end of the second frame assembled to the pair of second hooks of the middle frame to which the end of the first frame is assembled, according to an embodiment. FIG. 14 is a cross-sectional view illustrating the ends of the first and second frames assembled on the pair of second hooks of the middle frame, according to an embodiment.

As shown in FIG. 12, when the display panel 10 is seated on the first frame 110, each of the opposite ends of the first frame 110 may be assembled to the middle frame 50. The first frame 110 may include extensions 111 extending vertically from the left and right ends of the first frame 110 corresponding to the left and right ends of the display panel 10 such that the opposite ends of the first frame 110 are assembled to the middle frame 50. The left end of the display panel 10 may be a lower left end of the display panel 10. The right end of the display panel 10 may be a lower right end of the display panel 10. Accordingly, the extensions 111 of the first frame 110 may extend vertically from the left and right ends of the first frame 110 toward the middle frame 50, respectively. In other words, the extension 111 extending from a left end of the first frame 110 may extend in a right direction. In addition, the extensions 111 extending from a right end of the first frame 110 may extend in a left direction (see FIG. 3).

The extensions 111 may be extended so that the corners of the display panel 10 have a rounded shape. In other words, since the corners of the first frame 110 are covering the border of the display panel 10, the corners of the display panel 10 may be extended to have a rounded shape. This may prevent a user from being injured by the corners of the display panel 10 (see FIG. 3).

As shown in FIGS. 13 and 14, with the display panel 10 seated on the first frame 110, the second frame 120 may be assembled to the middle frame 50. The assembly grooves 121 formed at the opposite ends of the second frame 120 may be assembled to the pair of second hooks 55 of the middle frame 50. In other words, a portion of the pair of second hooks 55 may be assembled into the assembly grooves 121 formed at the opposite ends of the second frame 120, and the remaining portion may be assembled into the hook grooves 113 of the first frame 110.

Each of the pair of second hooks 55 may be integrally formed. Since each of the pair of second hooks 55 formed integrally is partially assembled into the first frame 110, and partially assembled into the second frame 120, a step between the end of the first frame 110 and the end of the second frame 120 may be prevented from occurring when the second frame 120 is assembled to the middle frame 50. In other words, when the second frame 120 is assembled to the middle frame 50, the extension 111, which is the end of the first frame 110, and the end of the second frame 120 may be in contact. Since the end of the first frame 110 and the end of the second frame 120 that are in contact are assembled to one second hook 55, the step between the end of the first frame 110 and the end of the second frame 120 may be prevented from occurring.

Figure 15:
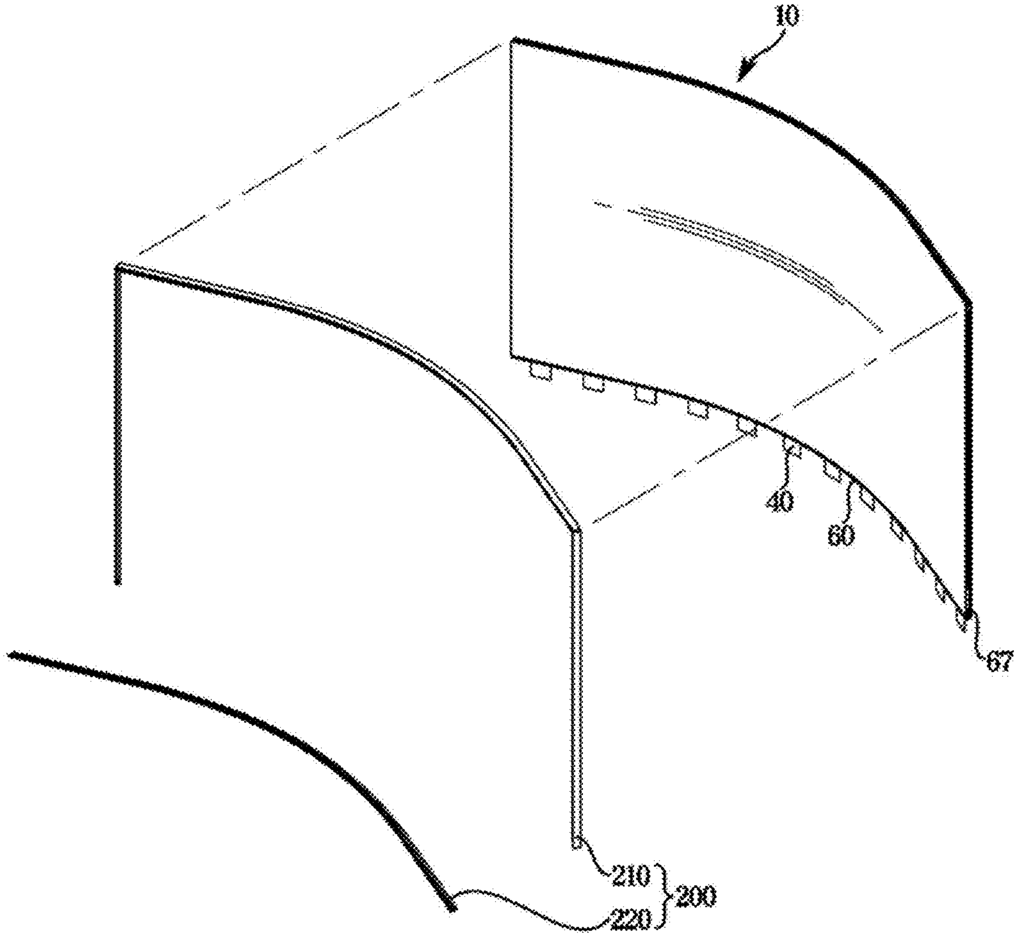
FIG. 15 is a view illustrating the frame separated from the display panel, according to an embodiment.
Figure 16:
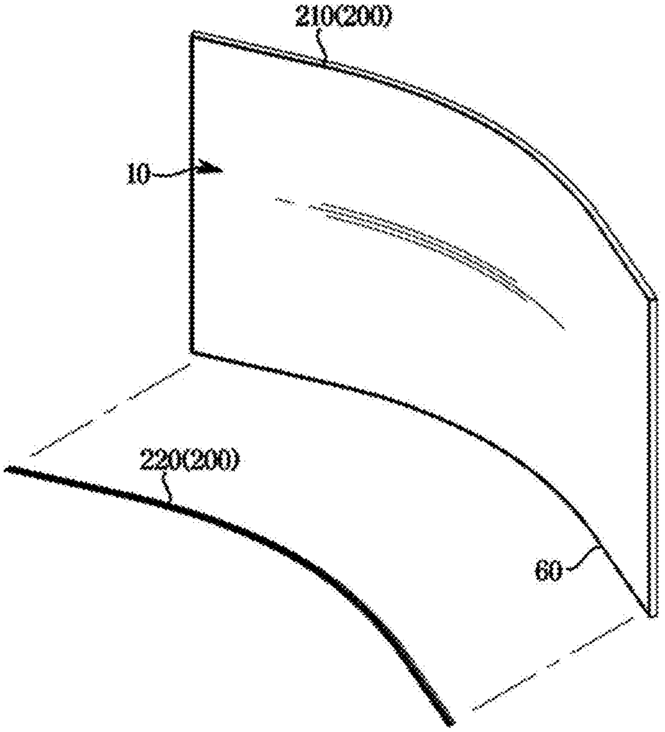
FIG. 16 is a view illustrating a first frame assembled and a second frame disassembled, according to an embodiment.
Figure 17:
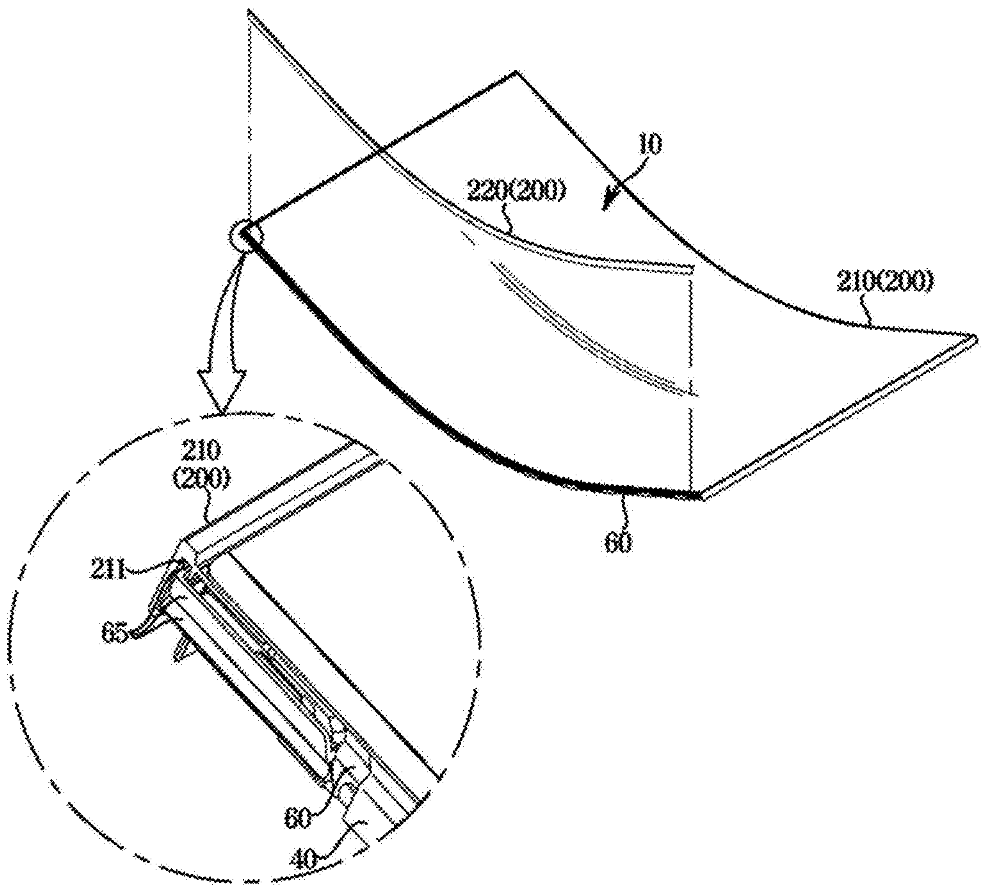
FIG. 17 is a view illustrating the second frame being assembled to a middle frame, according to an embodiment.
Figure 18:
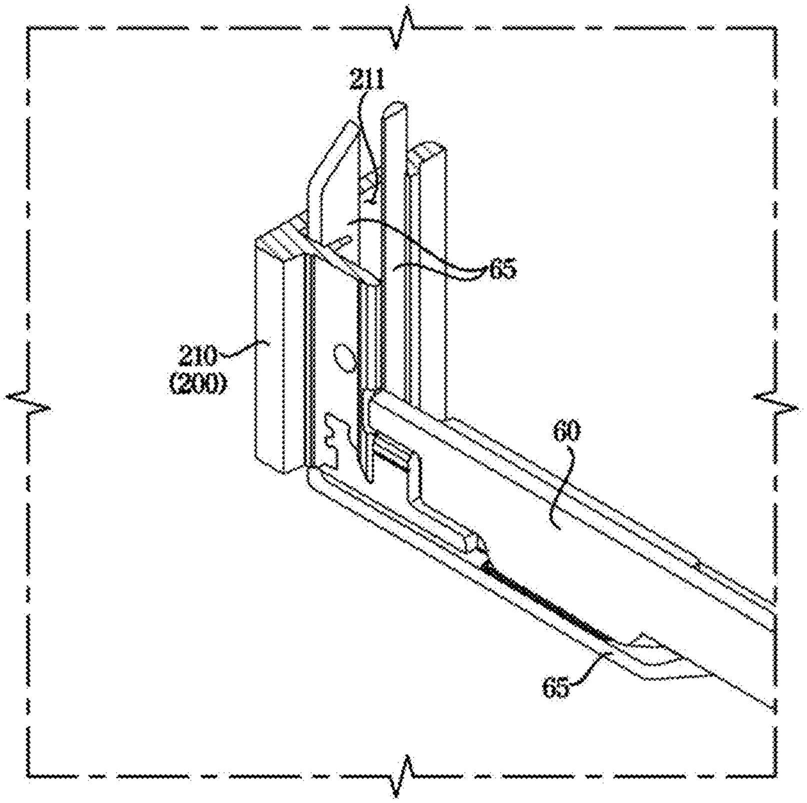
FIG. 18 is a cross-sectional view illustrating an end of the first frame assembled to a pair of second hooks of the middle frame, according to an embodiment.
Figure 19:
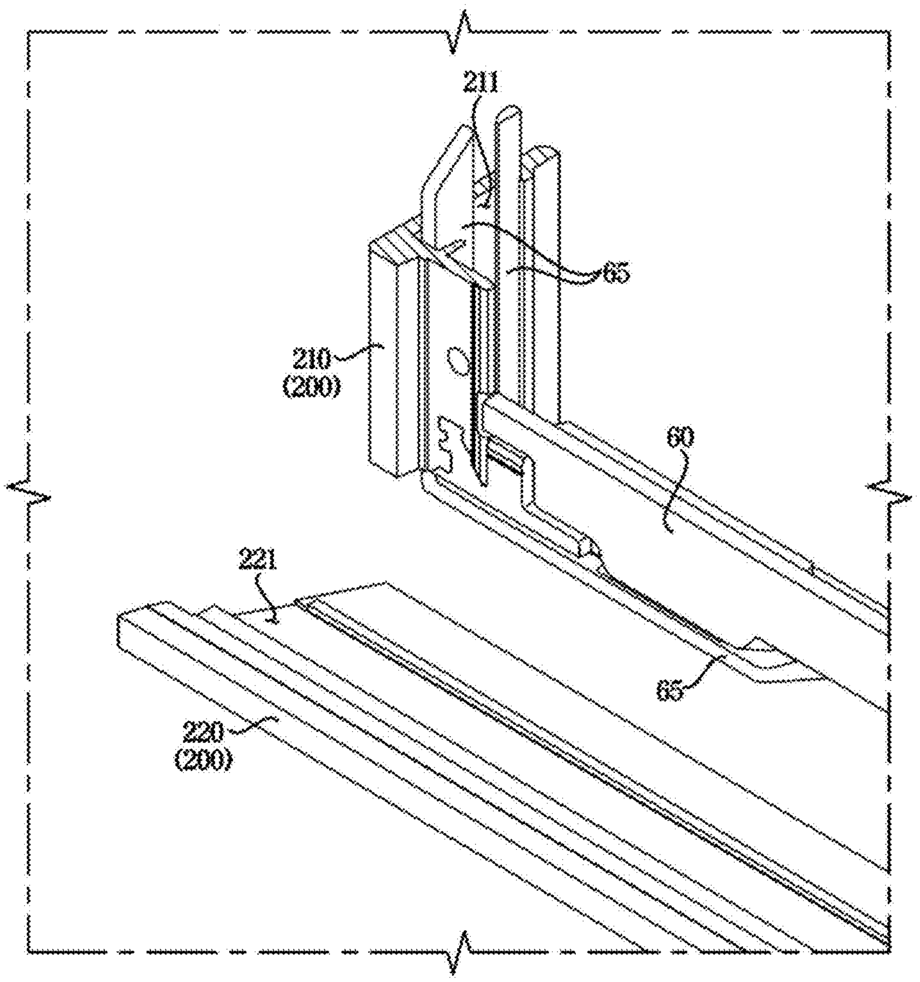
FIG. 19 is a view illustrating an end of the second frame assembled on the pair of second hooks of the middle frame to which the end of the first frame is assembled, according to an embodiment.
Figure 20:
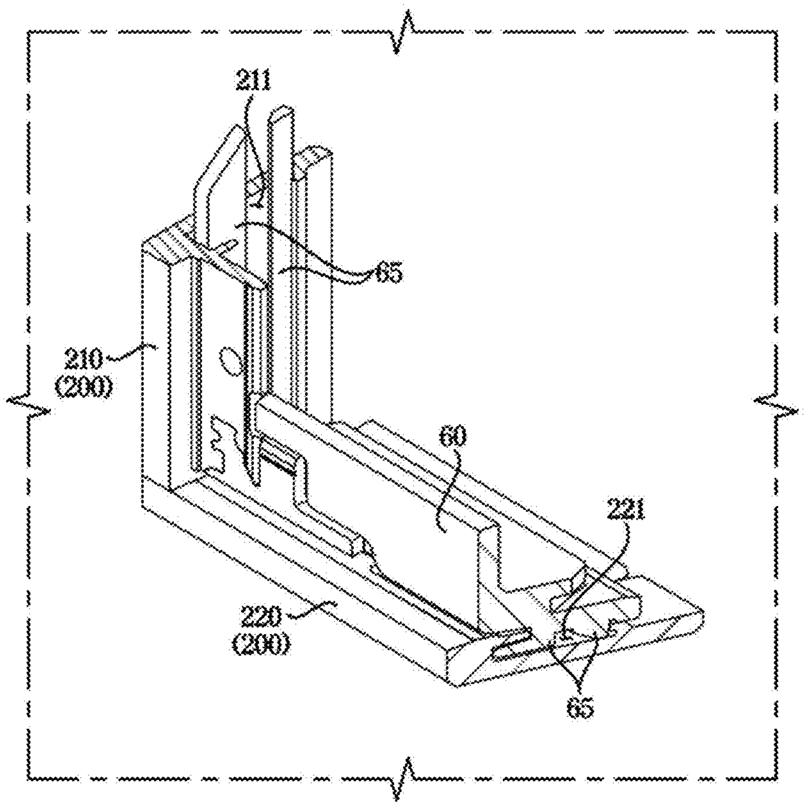
FIG. 20 is a cross-sectional view illustrating the ends of the first and second frames assembled on the pair of second hooks of the middle frame, according to an embodiment.

FIG. 15 is a view illustrating the frame separated from the display panel, according to an embodiment. FIG. 16 is a view illustrating a first frame assembled and a second frame disassembled, according to an embodiment. FIG. 17 is a view illustrating the second frame being assembled to a middle frame, according to an embodiment. FIG. 18 is a cross-sectional view illustrating an end of the first frame, according to an embodiment, assembled to a pair of second hooks of the middle frame. FIG. 19 is a view illustrating an end of the second frame assembled on the pair of second hooks of the middle frame to which the end of the first frame is assembled, according to an embodiment. FIG. 20 is a cross-sectional view illustrating the ends of the first and second frames assembled on the pair of second hooks of the middle frame, according to an embodiment.

As shown in FIGS. 15 and 16, the display device may include a display module that displays image information and a stand that rotatably supports the display module.

All configurations of the display module including the display panel 10, a frame 200 on which the display panel 10 is seated, and the like may be the same as the configurations shown in FIGS. 1 to 14. Accordingly, only configurations different from the configuration of the display device shown in FIGS. 1 to 14 will be described.

Although all of the configurations according to an embodiment are the same as the configurations of the display device shown in FIGS. 1 to 14, a configuration of the frame 200 on which the display panel 10 is seated and a configuration of the middle frame 60 on which an end of the first frame 210 and a second frame 220 are assembled may be partially different. Accordingly, only some different configurations will be described, and all configurations that are not described may be the same.

The middle frame 60 may be provided at the lower end of the display panel 10. The middle frame 60 may be injection molded. The middle frame 60 may be provided at the lower end of the display panel 10 and may be exposed to the outside. The middle frame 60 may include extensions 67 extending vertically upward from the left and right ends of the middle frame 60 corresponding to opposite ends of the lower end of the display panel 10. The middle frame 60 may guide the COF 40 connected to the lower end of the display panel 10 to bend toward the rear side of the display panel 10. The middle frame 60 will be described in more detail below.

The display panel 10 may be seated on the frame 200. The frame 200 may be extrusion molded. The frame 200 may cover the four side borders of the display panel 10 without a bezel. In other words, the frame 200 may cover the upper, lower, left, and right borders of the display panel 10. The frame 200 may form the appearance of the four side borders of the display panel 10.

The frame 200 may include the first frame 210 formed in a C-shape to cover the upper, left, and right borders of the display panel 10. The display panel 10 may be seated on the first frame 210. Based on the display panel 10 being seated on the first frame 210, the lower end of the display panel 10 may be exposed to the outside because the first frame 210 is formed in the C-shape to cover the upper, left, and right borders of the display panel 10. In other words, based on the display panel 10 being seated on the first frame 210, the middle frame 60 provided at the lower end of the display panel 10 may be exposed to the outside.

The frame 200 may include the second frame 220 formed in a bar shape to cover the lower border of the display panel 10. The second frame 220 may be assembled to the middle frame 60 at the lower end of the display panel 10 exposed to the outside.

The first frame 210 and the second frame 220 may be provided separately to cover the four side borders of the display panel 10. In other words, after the display panel 10 is seated on the first frame 210, the second frame 220 covering the lower border of the display panel 10 may be hook-assembled to the middle frame 60 after the COF 40 connected to the lower end of the display panel 10 is bent toward the rear side of the display panel 10.

As shown in FIGS. 17 to 20, when the display panel 10 is seated on the first frame 210, the opposite ends of the first frame 210 may be assembled to the middle frame 60, respectively. The middle frame 60 may include the extensions 67 extending vertically upward from the left and right ends of the middle frame 60 corresponding to the opposite ends of the lower end of the display panel 10 such that the opposite ends of the first frame 210 may be assembled to the middle frame 60 (see FIG. 15).

With the display panel 10 seated on the first frame 210, the second frame 220 may be assembled to the middle frame 60. Assembly grooves 221 formed at the opposite ends of the second frame 220 may be assembled to a pair of second hooks 65 of the middle frame 60. In other words, a portion of the second hooks 65 may be assembled into the assembly grooves 221 formed at the opposite ends of the second frame 220, and the remaining portion may be assembled into hook grooves 211 of the first frame 210.

Each of the pair of second hooks 65 may be integrally formed. A portion of each of the pair of second hooks 65 formed integrally may be partially formed on the extensions 67 to be assembled to the first frame 210, and the remaining portion may be assembled to the second frame 220. In other words, the pair of second hooks 65 formed on the middle frame 60 may be formed in an L-shape. Since each of the pair of second hooks 65 formed integrally is partially assembled to the first frame 210, and partially assembled to the second frame 220, a step between the end of the first frame 210 and the end of the second frame 220 may be prevented from occurring when the second frame 220 is assembled to the middle frame 60. In other words, when the second frame 220 is assembled to the middle frame 60, the end of the first frame 210 and the end of the second frame 220 may be in contact. Since the end of the first frame 210 and the end of the second frame 220 that are in contact are assembled to one second hook 65, the step between the end of the first frame 210 and the end of the second frame 220 may be prevented from occurring.

Figure 21:
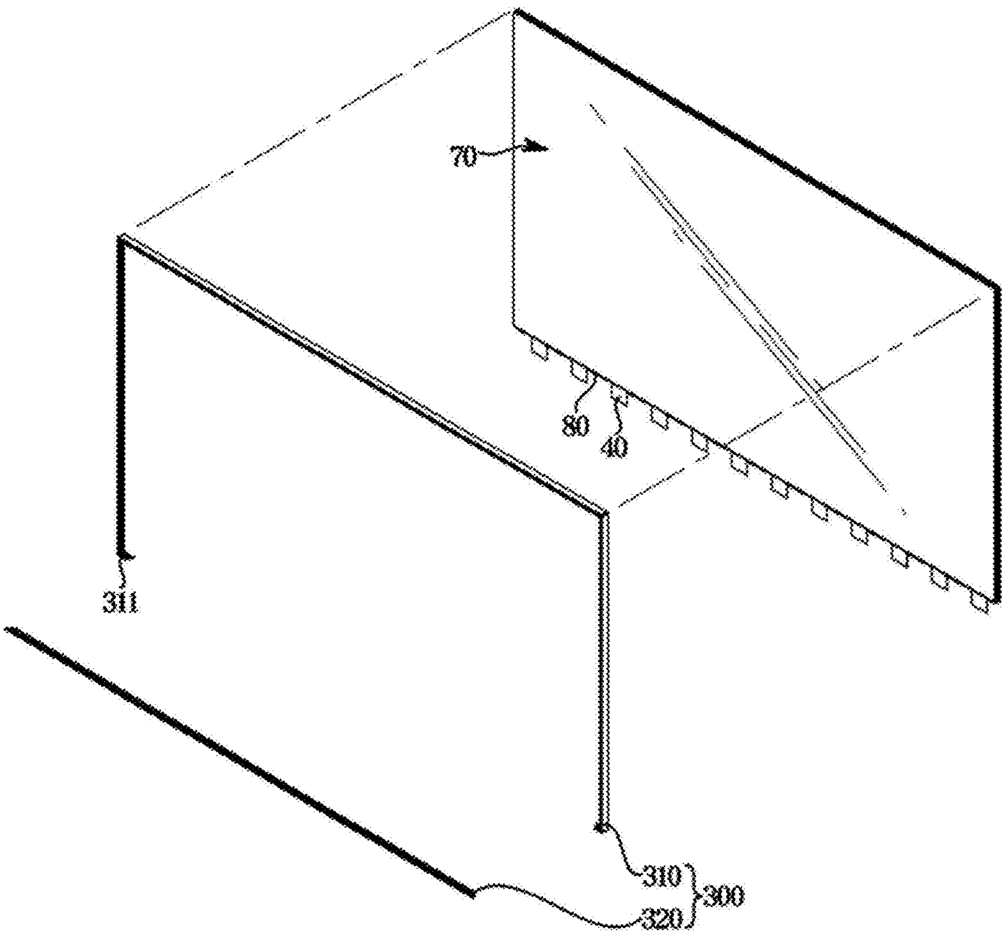
FIG. 21 is a view illustrating a frame separated from the display panel, according to an embodiment.
Figure 22:
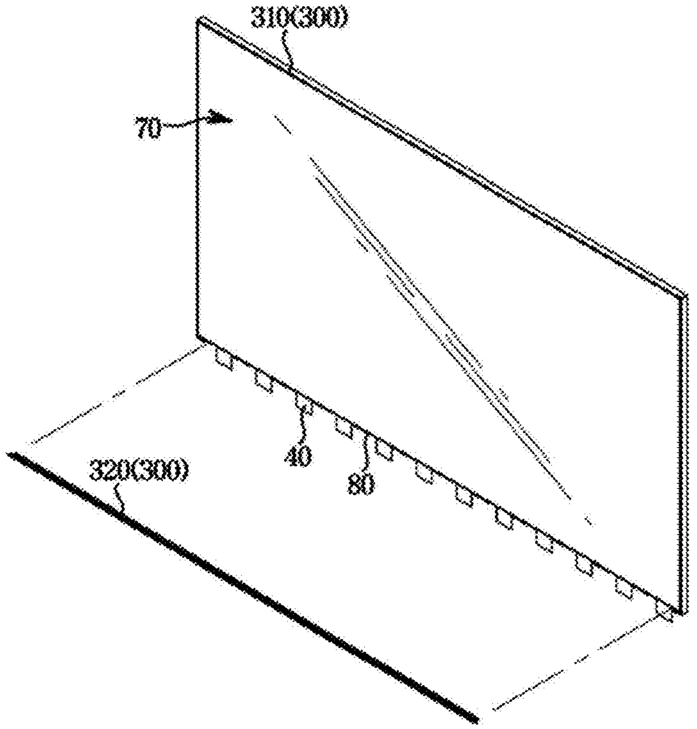
FIG. 22 is a view illustrating a first frame assembled and a second frame separated, according to an embodiment.
Figure 23:
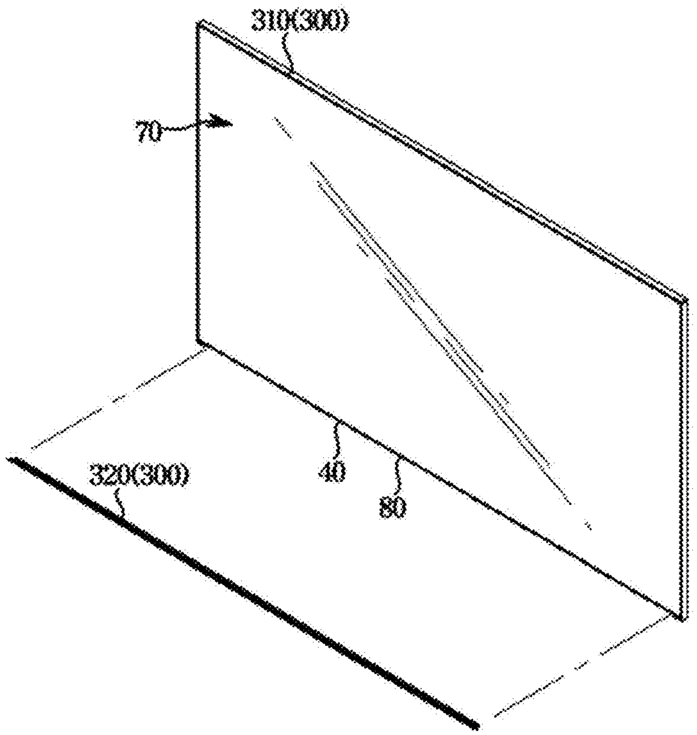
FIG. 23 is a view illustrating the second frame being assembled to a middle frame, according to an embodiment.
Figure 24:
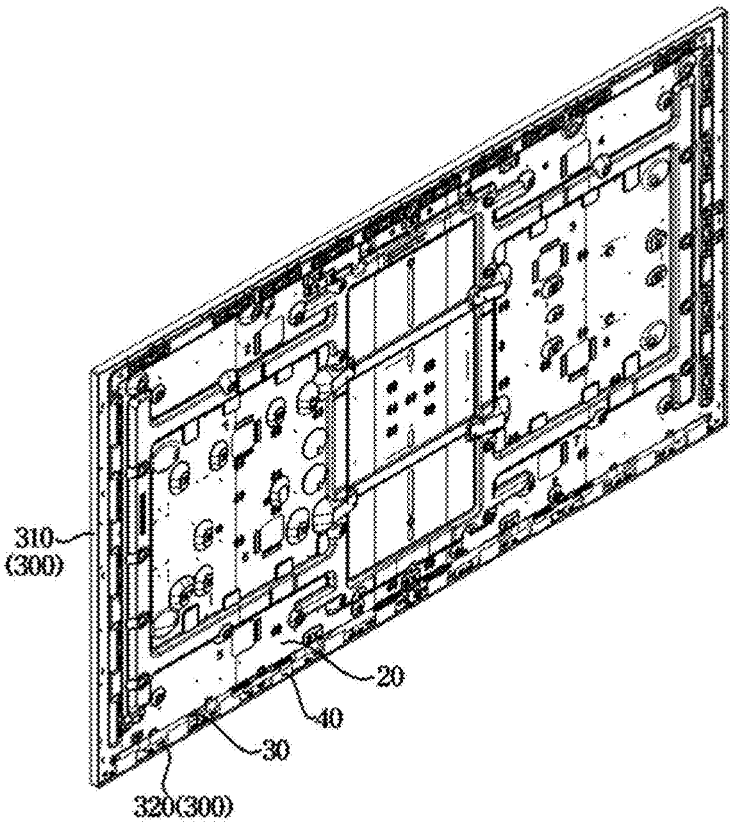
FIG. 24 is a rear view of the second frame assembled to the middle frame, according to an embodiment.

FIG. 21 is a view illustrating a frame separated from the display panel, according to an embodiment. FIG. 22 is a view illustrating a first frame assembled and a second frame separated, according to an embodiment. FIG. 23 is a view illustrating the second frame being assembled to a middle frame, according to an embodiment. FIG. 24 is a rear view of the second frame assembled to the middle frame, according to an embodiment.

As shown in FIGS. 21 to 24, the display device may include a display module that displays image information and a stand that rotatably supports the display module.

All configurations of the display module including a display panel 70, a frame 300 on which the display panel 70 is seated may be the same as the configurations shown in FIGS. 1 to 14. However, the display device may be a flat panel display device in which the display panel 70 is a flat surface. In other words, the shape of the display panel 70 may be different from the configurations shown in FIGS. 1 to 14 in that the display panel 70 is a rectangular flat surface. In addition, the shapes of a middle frame 80 and the frame 300 may be different from the shapes of the middle frame 40 and the frame 100 shown in FIGS. 1 to 14 in order to correspond to the shape of the display panel 70. Except for some of the configurations described above, all of the remaining configurations thereof may be the same, so that their descriptions will be omitted.

According to various embodiments of the present disclosure, breakage of the COF may be prevented when organizing the COF.

Further, by preventing breakage of the COF, quality reliability may be increased and processes may be improved.

Further, no screws may be required to assemble the frame, thereby providing a design differentiation.

The above-described embodiments are merely specific examples to describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. A display device comprising:

a display panel;

a rear chassis provided on a rear side of the display panel;

a middle frame provided on a lower end of the display panel, and comprising a plurality of hooks;

a first frame in which the display panel is provided, and covering an upper border, a left border, and a right border of the display panel to cause the middle frame at the lower end of the display panel to be exposed; and a second frame comprising an assembly groove assembled to the plurality of hooks, and provided in a bar shape to cover a lower border of the display panel by being assembled to the middle frame, wherein the plurality of hooks comprises:

a plurality of first hooks assembled to the assembly groove of the second frame, and a pair of second hooks provided at opposite ends of the middle frame and assembled to opposite ends of the first frame and opposite ends of the second frame, and wherein the opposite ends of the first frame are in contact with opposite ends of the second frame.

2. The display device of claim 1, wherein a chip-on film (COF) is connected to the lower end of the display panel and configured to transmit a drive signal from a drive printed circuit board to the display panel.

3. The display device of claim 2, wherein the COF is guided by the middle frame to bend toward the rear side of the display panel such that the COF is not exposed to the outside, and wherein the second frame is assembled to the middle frame in a state in which the COF is bent.

4. The display device of claim 1, wherein the first frame comprises a hook groove provided at the opposite ends of the first frame and to which the pair of second hooks are assembled.

5. The display device of claim 4, wherein a portion of the pair of the second hooks is assembled to the assembly groove at the opposite ends of the second frame, and a remaining portion is assembled to the hook groove of the first frame, and wherein, in a state in which the second frame is assembled to the middle frame, an end of the first frame is aligned with an end of the second frame.

6. The display device of claim 1, wherein the middle frame has a length corresponding to the lower end of the display panel.

7. The display device of claim 6, wherein the first frame comprises an extension extending horizontally from left and right ends of the first frame corresponding to left and right ends of the display panel so as to be assembled to the middle frame.

8. The display device of claim 7, wherein the extension is extended so that corners of the display panel have a round shape.

9. The display device of claim 7, wherein each second hook among the pair of second hooks is integrally formed, a portion of which is assembled to the second frame, and a remaining portion of which is assembled to the extension of the first frame.

10. The display device of claim 1, wherein the middle frame comprises an extension extending vertically from left and right ends of the middle frame corresponding to opposite ends of the lower end of the display panel.

11. The display device of claim 10, wherein left and right ends of the first frame have a length corresponding to left and right ends of the display panel which are assembled to the extension of the first frame.

12. The display device of claim 11, wherein each second hook among the pair of second hooks is integrally formed, a portion of which is formed on the extension and assembled to the first frame, and a remaining portion of which is assembled to the second frame.

13. The display device of claim 1, wherein the assembly groove comprises a first assembly groove to which the plurality of first hooks is assembled, and a second assembly groove to which the pair of second hooks is assembled.

14. The display device of claim 13, wherein the first assembly groove and the second assembly groove are connected to a single groove.

15. The display device of claim 13, wherein the first assembly groove is provided at a plurality at positions corresponding to the plurality of first hooks, and the second assembly groove is provided at the opposite ends of the second frame corresponding to the pair of second hooks.

* * * * *